United States Patent
Choi et al.

(10) Patent No.: US 10,847,577 B2
(45) Date of Patent: Nov. 24, 2020

(54) MEMORY AND LOGIC DEVICE-INTEGRATED SOFT ELECTRONIC SYSTEM

(71) Applicant: Korea Advanced Institute of Science and Technology, Daejeon (KR)

(72) Inventors: Sung Yool Choi, Daejeon (KR); Byung Chui Jang, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/472,218

(22) PCT Filed: Jun. 30, 2017

(86) PCT No.: PCT/KR2017/006949
§ 371 (c)(1),
(2) Date: Jun. 21, 2019

(87) PCT Pub. No.: WO2018/117358
PCT Pub. Date: Jun. 28, 2018

(65) Prior Publication Data
US 2019/0355787 A1 Nov. 21, 2019

(30) Foreign Application Priority Data
Dec. 21, 2016 (KR) .................. 10-2016-0175646

(51) Int. Cl.
*H01L 27/24* (2006.01)
*H01L 45/00* (2006.01)
*G11C 13/00* (2006.01)
*H03K 19/20* (2006.01)

(52) U.S. Cl.
CPC .......... *H01L 27/24* (2013.01); *G11C 13/0007* (2013.01); *H01L 45/1253* (2013.01); *H01L 45/147* (2013.01); *H03K 19/20* (2013.01)

(58) Field of Classification Search
CPC ... H01L 27/24; H01L 45/1253; H01L 45/147; G11C 13/0047; H03K 19/20
USPC .......................................................... 257/4
See application file for complete search history.

(56) References Cited

U.S. PATENT DOCUMENTS

| | | | |
|---|---|---|---|
| 7,302,513 B2 | 11/2007 | Mouttet | |
| 7,609,086 B2 | 10/2009 | Mouttet | |
| 7,902,857 B1 | 3/2011 | Pino | |
| 7,902,867 B2 | 3/2011 | Mouttet | |
| 8,113,437 B2 | 2/2012 | Kang | |
| 2006/0151616 A1* | 7/2006 | Sheats | G11C 13/0014 235/492 |

(Continued)

OTHER PUBLICATIONS

International Search Report dated Oct. 17, 2017 in counterpart International Patent No. PCT/KR2017/006949 (2 pages in English and 2 pages in Korean).

*Primary Examiner* — Tong-Ho Kim
(74) *Attorney, Agent, or Firm* — NSIP Law

(57) ABSTRACT

Provided is a memory- and logic device-integrated soft electronic system, the memory- and logic device-integrated soft electronic system including: a substrate 100; a plurality of bar-shaped first electrodes 110 stacked on the substrate; a resistance-variable material layer 120 coated on the lower electrode; and a plurality of bar-shaped second electrodes 130 stacked on the resistance-variable material layer 120, wherein the first electrode and the second electrode cross each other.

6 Claims, 10 Drawing Sheets

(56) References Cited

U.S. PATENT DOCUMENTS

| | | |
|---|---|---|
| 2009/0184397 A1 | 7/2009 | Gergel-Hackett et al. |
| 2013/0122680 A1 | 5/2013 | Jo |
| 2014/0151623 A1* | 6/2014 | Jeon .................... H01L 45/146 257/2 |
| 2015/0256178 A1* | 9/2015 | Kvatinsky ............ H03K 19/177 326/31 |

* cited by examiner

[FIG. 1]
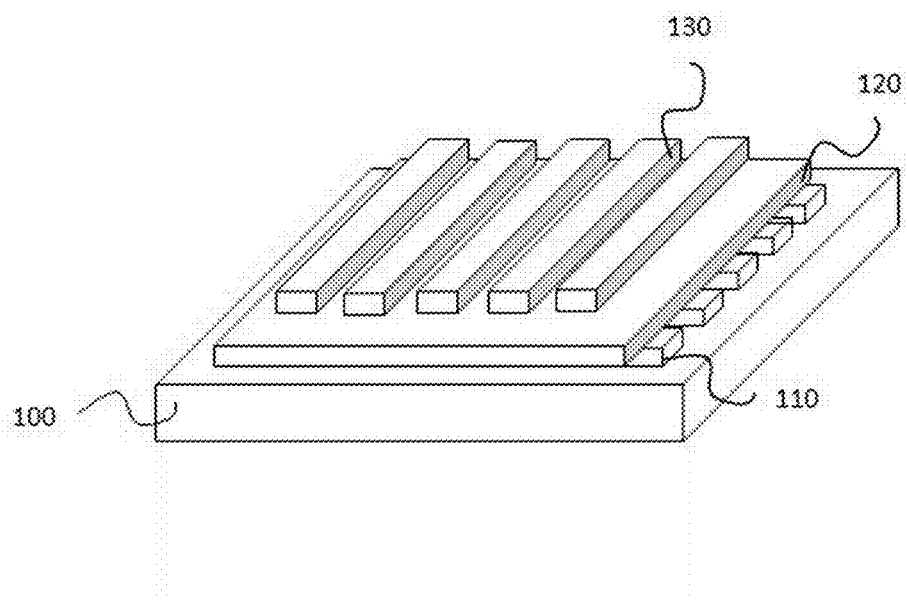

[FIG. 2]
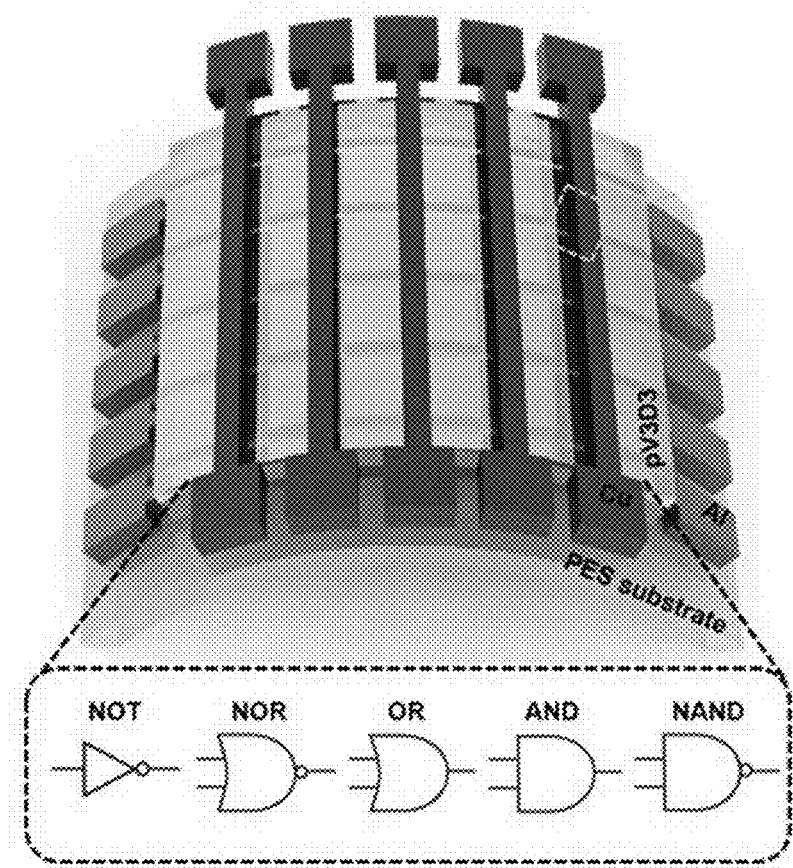

[FIG. 3]
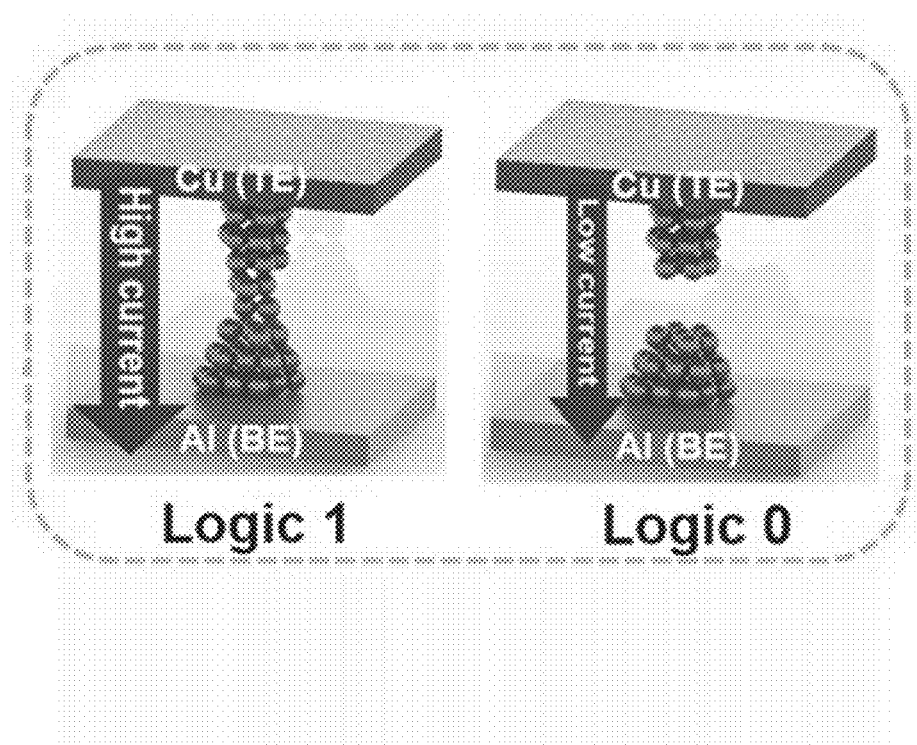

[FIG. 4]
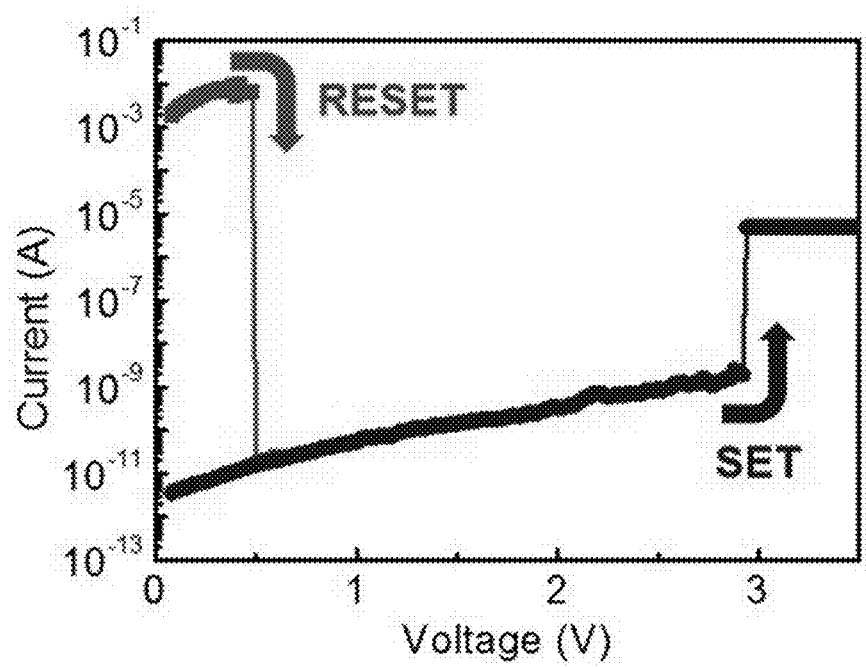

[FIG. 5]
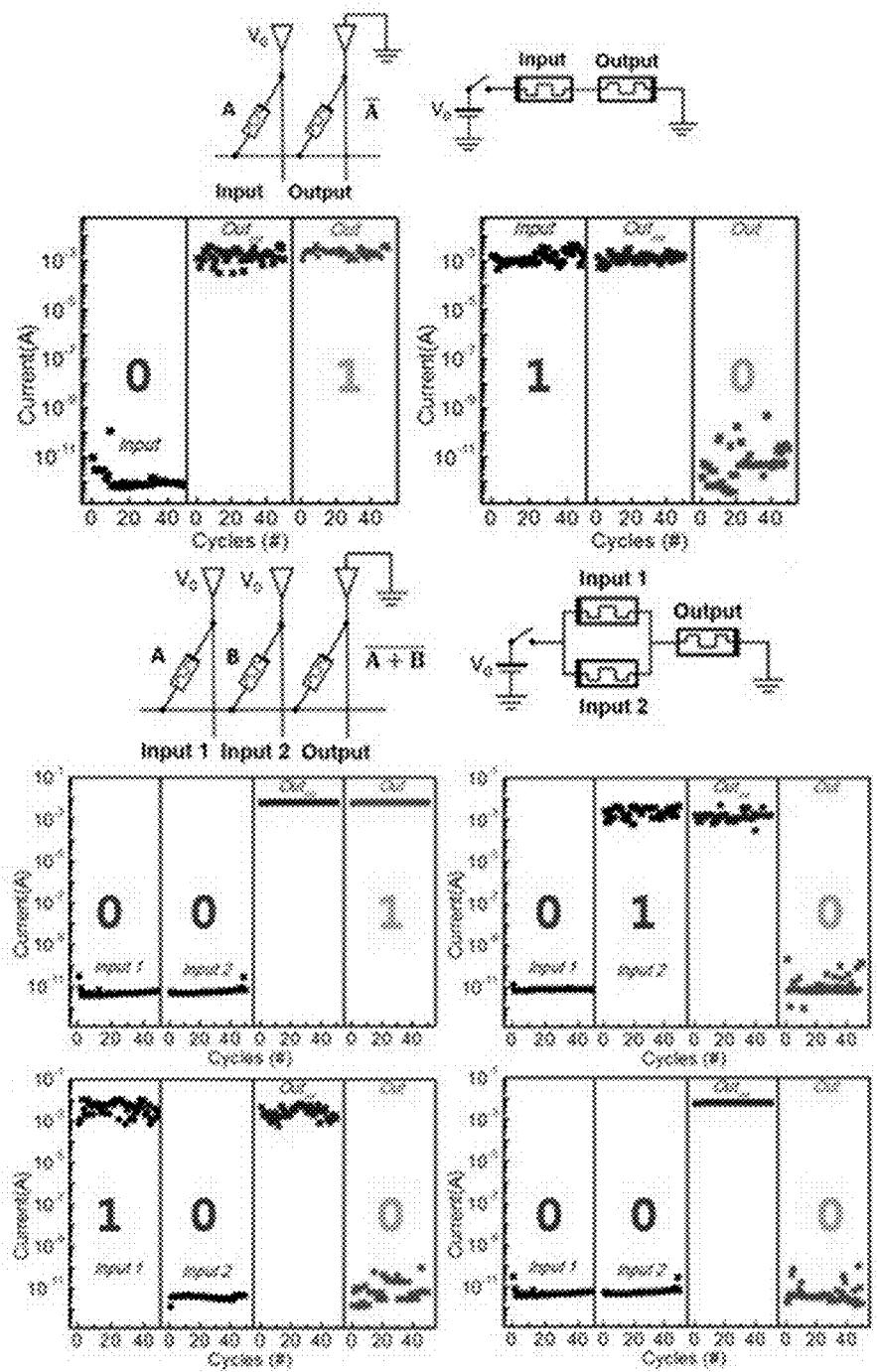

[FIG. 6]
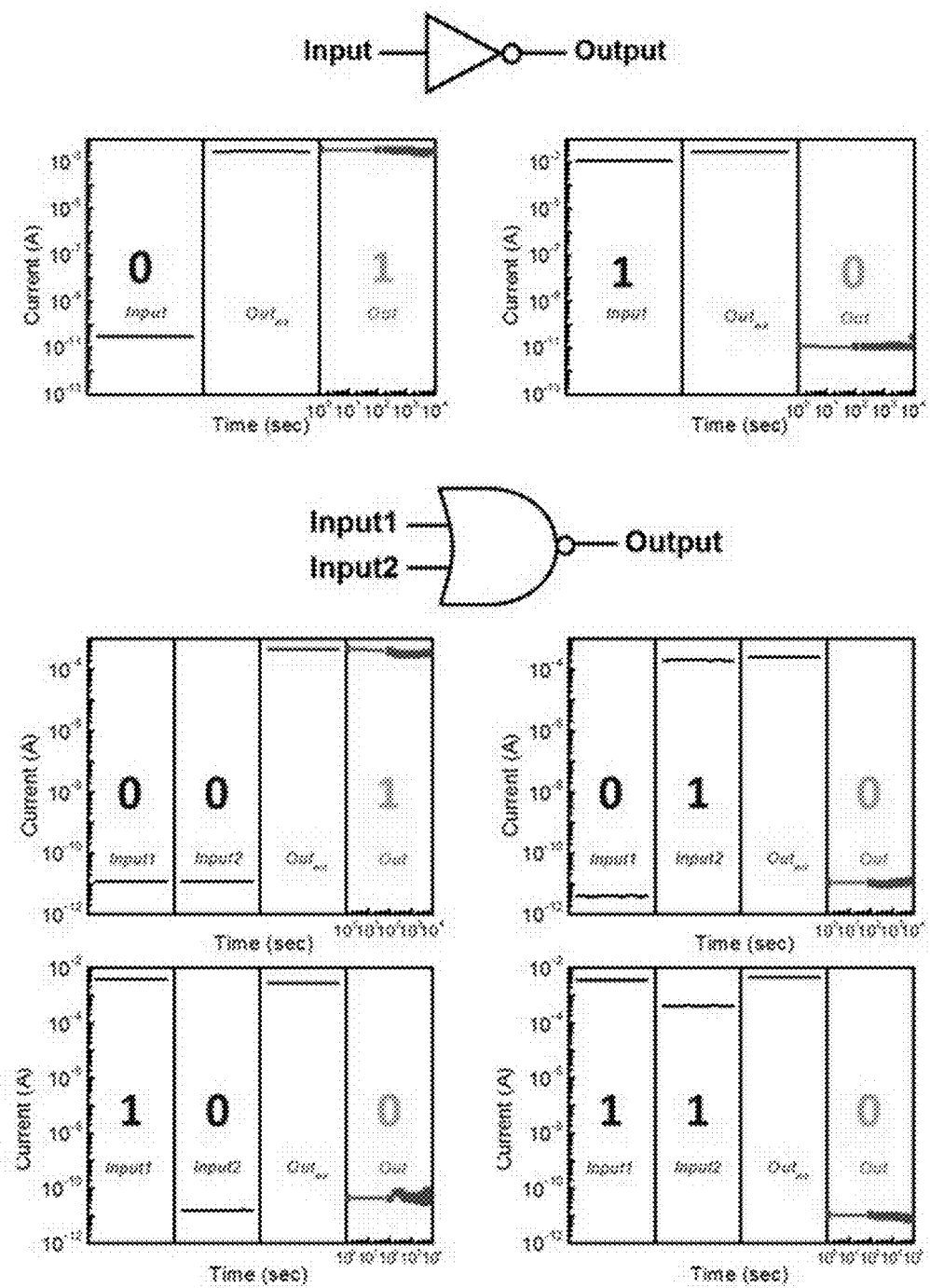

[FIG. 7]
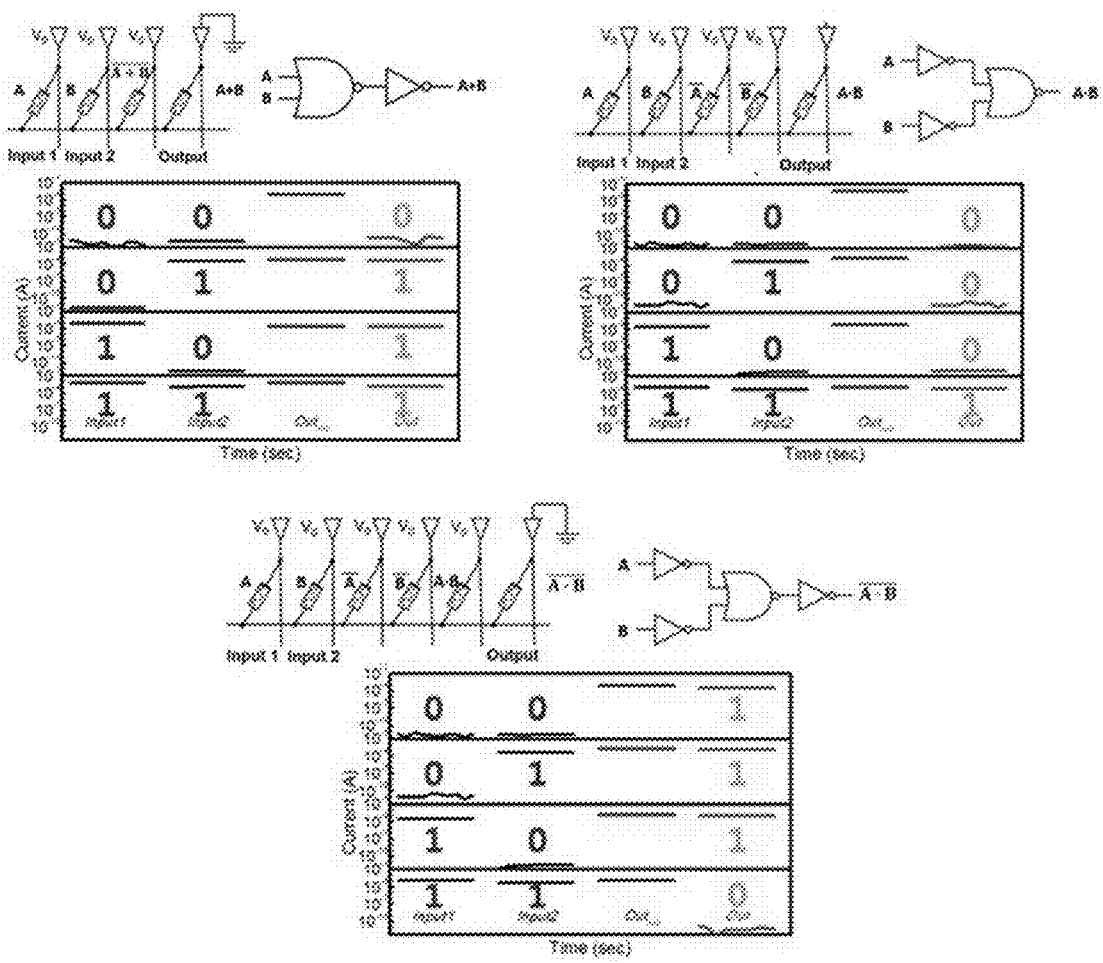

[FIG. 8]
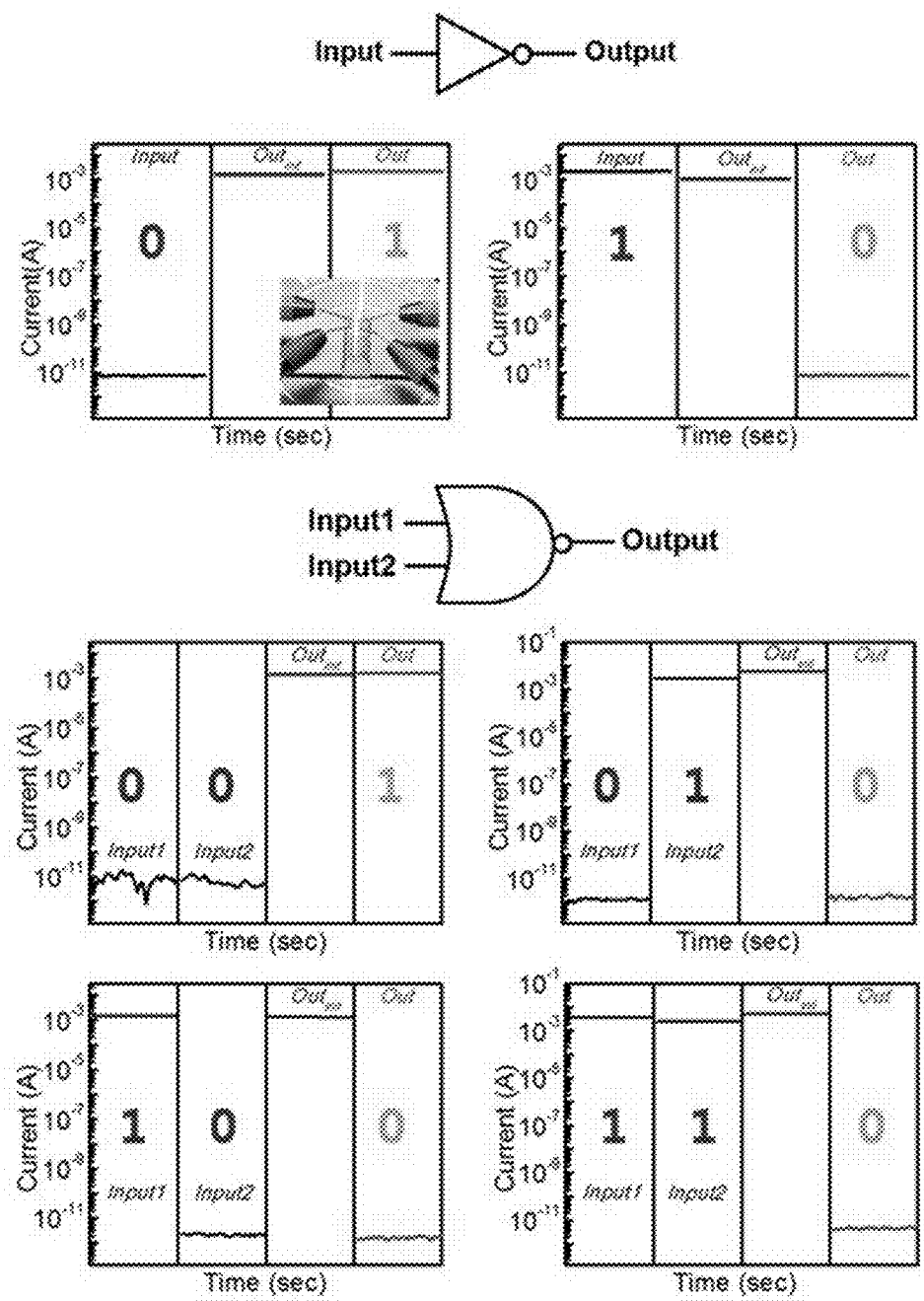

[FIG. 9]
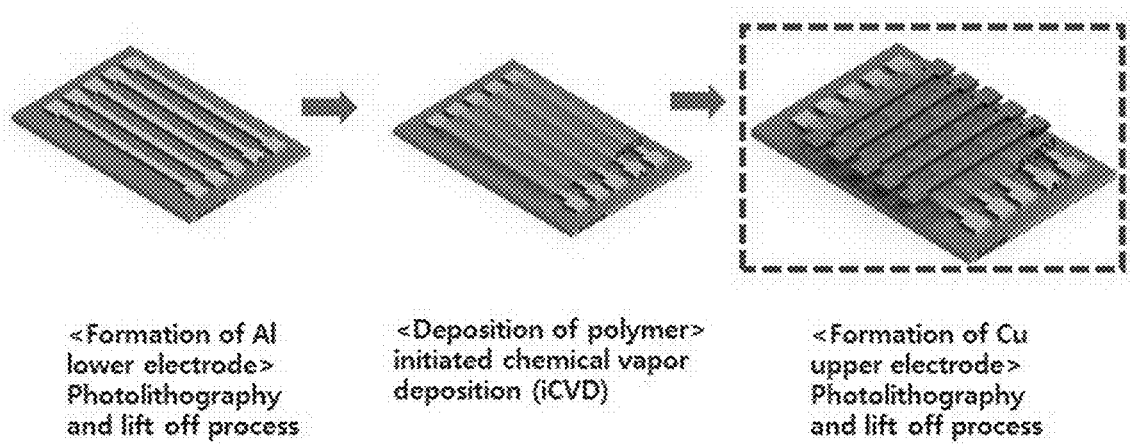
[FIG. 10]
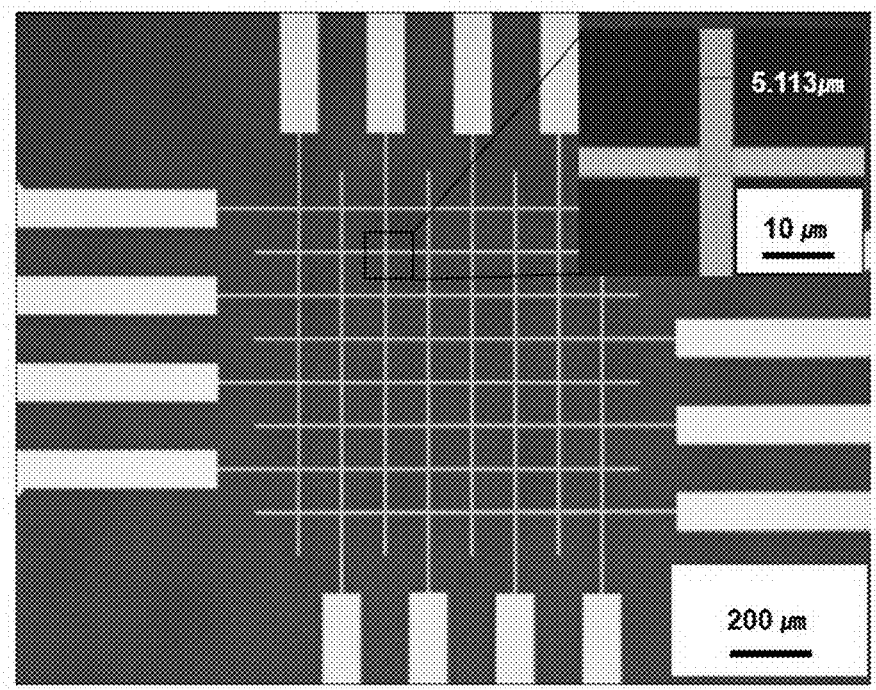

[FIG. 11]
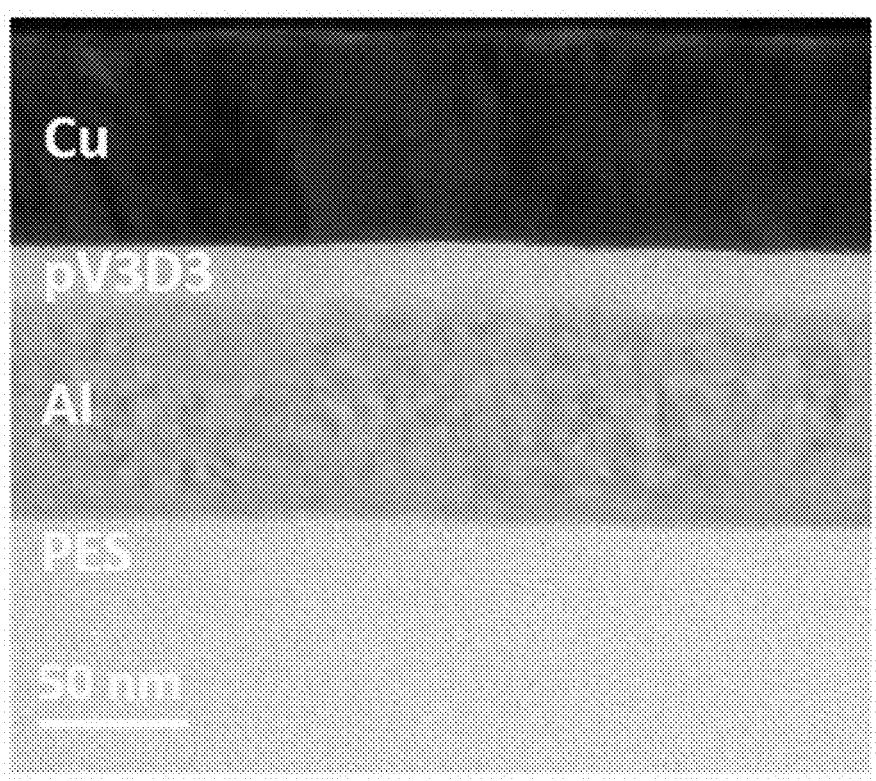

MEMORY AND LOGIC DEVICE-INTEGRATED SOFT ELECTRONIC SYSTEM

CROSS REFERENCE TO RELATED APPLICATIONS

This application is a U.S. National Stage Application of International Application No. PCT/KR2017/006949, filed on Jun. 30, 2017, which claims the benefit under 35 USC 119(a) and 365(b) of Korean Patent Application No. 10-2016-0175646, filed on Dec. 21, 2016, in the Korean Intellectual Property Office, the entire disclosure of which is incorporated herein by reference for all purposes.

TECHNICAL FIELD

The present disclosure relates to a memory- and logic device-integrated soft electronic system, more particularly to a memory- and logic device-integrated soft electronic system that can significantly reduce standby power by utilizing a soft memristor and can be used in various flexible devices and wearable devices.

BACKGROUND ART

In order to implement a soft electronic system, it is important to implement a memory and a logic device which serve for storage and processing of information on a soft platform.

In particular, because most of flexible soft electronic products such as a smart watch, a smart band, smart glass, etc. have long standby time and receive power from batteries, it is also important to establish a system capable of reducing standby power consumption.

Thus, the development of a non-volatile memory- and logic device-integrated soft electronic system capable of improving the inefficient computing power of the existing von Neumann architecture-based system, in which a memory and a logic device are separated, and the extreme standby power consumption is necessary.

Meanwhile, a memristor proposed by in 1971 by Professor Leon Chua as the fourth passive element is a two-terminal device whose resistance state is changed by electrical stimulation. The memristor is a device which remembers the direction and amount of current or voltage just before power supply is turned off. In particular, because of fast switching speed, low power consumption and high integrability due to its nanoscale thickness and simple structure, it has been developed for application to flexible memories.

Furthermore, the memristor can also be applied to basic blocks such as a logic gate, an artificial neural network, an analog circuit, etc. The patents about the application of the memristor include a programmable logic [41], signal processing (U.S. Pat. No. 7,302,513), a neural network [42], a control system (U.S. Pat. No. 7,609,086), reconfigurable computing (U.S. Pat. No. 7,902,857), a brain-computer interface (U.S. Pat. No. 7,902,867) and RFID (U.S. Pat. No. 8,113,437).

Among them, the memristor-based logic gate shows the possibility to develop a new soft electronic system in which a memory and a logic device are integrated because it can be operated as a non-volatile logic-in-memory.

The non-volatile logic-in-memory-based electronic system has the advantage of greatly reducing the standby power consumption of the system due to the non-volatile nature of the memristor itself, unlike the existing system with the issue of standby power consumption due to the subthreshold leakage current of the complementary transistor logic.

The concept of this memristor-based logic gate was first presented in 2010 by HP as an IMPLY logic gate using the material implication logic operation. The IMPLY logic gate using the memristor designates a logic value as a resistance value unlike the conventional transistor-based logic gate which specifies the logic value as voltage. And, the memristors in the crossbar array acts as elements of input, output and logic operation. Furthermore, because the information stored in the memristor can be used directly for calculation processing, logic-in-memory driving is possible.

However, in order to perform logic operation in this way, an additional resistance element is necessary in addition to at least two pulse voltages and the memristor. In addition, there is a disadvantage that the output value of the logic operation is stored in one of input memristors, not in the specified memristor.

The memristor-aided logic (MAGIC) has been proposed theoretically to compensate for these problems of the IMPLY logic gate. According to this method, basic logic operation can be performed using one pulse voltage with no additional resistance element, and the output value of the logic operation is stored in the specified memristor because the input memristor and the output memristor are separated.

However, the development of a memory- and logic device-integrated soft electronic system using this method is necessary because a logic gate using the MAGIC method has not yet been implemented on a soft platform.

DISCLOSURE

Technical Problem

Accordingly, the present disclosure is directed to providing a new memristor-based soft electronic system in which a logic device and a memory device are integrated.

Technical Solution

In order to solve the above problem, the present disclosure provides a memory- and logic device-integrated soft electronic system, which includes: a substrate 100; a plurality of bar-type first electrodes 110 stacked on the substrate; a resistance-variable material layer 120 coated on the first electrode; and a plurality of bar-shaped second electrodes 130 stacked on the resistance-variable material layer 120, wherein the first electrode and the second electrode cross each other.

According to an exemplary embodiment of the present disclosure, the resistance-variable material layer 120 is coated on the entire surface of the first electrode 110, and the second electrode 130 is provided on the resistance-variable material layer 120.

According to an exemplary embodiment of the present disclosure, the memory- and logic device-integrated soft electronic system configures a logic gate in accordance with the MAGIC method.

According to an exemplary embodiment of the present disclosure, the logic gate is NOT, NOR, OR, AND or NAND.

According to an exemplary embodiment of the present disclosure, the first electrode and the second electrode contain one selected from Cu, Ni, Ti, Hf, Zr, ZN, W, Co, V, Al and Pt.

According to an exemplary embodiment of the present disclosure, the resistance-variable material layer 120 contains a polymer-deposited insulating film, metal oxide or perovskite material.

According to an exemplary embodiment of the present disclosure, the polymer includes any one selected from a group consisting of poly(cyclosiloxane), poly(furfuryl methacrylate), poly(isobornyl acrylate), poly(1,3,5-trimethyl-1,3,5-trivinylcyclotrisiloxane), poly(ethylene glycol dimethacrylate) and graphene oxide.

According to an exemplary embodiment of the present disclosure, the substrate has a flexible property.

Advantageous Effects

According to the present disclosure, a soft memristor is configured on a soft platform in the form of a crossbar array, and the memory function of storing information in the soft memristor present on the crossbar array and the logic operation function of processing the stored information are implemented at the same time. Further, a soft electronic system capable of significantly reducing standby power consumption can be implemented using the memristor on various soft platforms via the memory and logic gate driving which is stable even under mechanical strain and the non-volatile nature of operation result.

BRIEF DESCRIPTION OF DRAWINGS

FIG. 1 is a schematic diagram of a memory- and logic device-integrated soft electronic system according to an exemplary embodiment of the present disclosure.

FIGS. 2 and 3 are a schematic diagram of a memory- and logic device-integrated soft electronic system according to an exemplary embodiment of the present disclosure and a diagram for illustrating the driving of the logic device.

FIG. 4 is a graph showing the log I-V characteristic of a soft memristor device according to an exemplary embodiment of the present disclosure.

FIG. 5 shows the stable characteristics of soft memristor-based NOT and NOR gates for 50 cycles, and FIG. 6 shows the non-volatile nature of soft memristor-based NOT and NOR gates.

FIG. 7 shows the characteristics of soft memristor-based OR, AND and NAND gates, and FIG. 8 shows the characteristics of soft memristor-based NOT and NOR gates driven stably even under mechanical strain.

FIG. 9 illustrates a method for fabricating a memristor-based soft integrated device according to an exemplary embodiment of the present disclosure.

FIG. 10 is a microscopic image of a memory- and logic device-integrated soft electronic system fabricated according to an exemplary embodiment of the present disclosure, and FIG. 11 is a cross-sectional TEM image of the device.

BEST MODE

Hereinafter, the exemplary embodiments and examples of the present disclosure are described in detail with reference to the accompanying drawings so that those of ordinary skill in the art to which the present disclosure belongs can easily carry out the present disclosure.

However, the present disclosure may be implemented in many different forms, not limited to the embodiments and examples set forth herein. In the drawings, irrelevant parts are omitted to clearly illustrate the present disclosure, and like reference numerals designate like elements throughout the specification.

Throughout the present specification, when describing that a certain portion "includes" a constituent element, it is not meant to exclude other components but means that other components may further be included, unless explicitly stated otherwise.

The terms relating to a degree such as "about", "substantially", etc. are used to indicate numerical values close to specified numerical values. They are used to aid in the understanding of the present disclosure and prevent improper use of the disclosure by an unscrupulous infringer. Further, throughout the present specification, " . . . a step of . . . ing" or "a step of . . . " does not mean "a step for . . . ".

Throughout the present specification, the expression "a combination thereof" included in the Markush-type expression means one or more mixture or combination selected from a group consisting of the components described in the Markush-type expression, and is meant to include at least one selected from the group consisting of the components.

Throughout the present specification, "A and/or B" represents "A or B, or A and B".

In order to solve the above problems, the present disclosure empirically implements a volatile memory- and logic device-integrated electronic system on a flexible substrate such as polyethersulfone (PES), polyimide (PI), polyethylene terephthalate (PET), etc. using a soft memristor and the MAGIC (memristor-aided logic) method.

FIG. 1 is a schematic diagram of a memory- and logic device-integrated soft electronic system according to an exemplary embodiment of the present disclosure.

Referring to FIG. 1, the soft electronic system according to an exemplary embodiment of the present disclosure consists of: a substrate 100; a first electrode 110 formed on the substrate; a resistance-variable material layer 120 formed on the first electrode layer; and a second electrode layer 130 formed on the resistance-variable material layer.

In an exemplary embodiment of the present disclosure, the substrate 100 may be a soft substrate having a flexible property, formed of at least one material selected from a group consisting of PMMA, PC, PES, PAR, PI, PET, PEN and PEEK, and thus may have a bendable property.

In an exemplary embodiment of the present disclosure, the first electrode 110 and the second electrode 130 may contain any one selected from Cu, Ni, Ti, Hf, Zr, ZN, W, Co, V, Al, and Pt.

The resistance-variable material layer 120, which is a resistance-variable film, may contain a polymer-deposited insulating film, and the polymer may be at least one selected from a group consisting of poly(furfuryl methacrylate), poly(isobornyl acrylate), poly(1,3,5-trimethyl-1,3,5-trivinylcyclotrisiloxane), poly(ethylene glycol dimethacrylate) and graphene oxide. In addition, a variety of resistance-variable materials reported previously such as a metal oxide ($Al_2O_3$, $TiO_2$, $HfO_2$, $Cu_2O$, etc.) or a perovskite material may be used in the resistance-variable material layer 120.

FIGS. 2 and 3 are a schematic diagram of a memory- and logic device-integrated soft electronic system according to an exemplary embodiment of the present disclosure and a diagram for illustrating the driving of the logic device.

Referring to FIGS. 1-3, the electronic device system according to an exemplary embodiment of the present disclosure consists of an array of a plurality of first electrodes 110, which are lower electrodes, and a resistance-variable material layer 120 stacked on the first electrode 110, which is insulated with a polymer insulating film and contains a resistance-variable material. The resistance-variable material layer 120 is coated on the entire surface of the first electrode 110 therebelow.

Second electrodes 130 are stacked on the resistance-variable material layer 120 in the form of lines spaced apart from each other, i.e., in the form of an array. The second electrode 130 is aligned vertically to the first electrode 110.

Therefore, as shown in FIG. 3, the resistance value of the resistance-variable film changes depending on the voltage applied to the second electrode 130. As a result, the memristor-based logic values 0 and 1 may be recognized from the final resistance values.

Thus, the logic values 0 and 1 can be stored for each cross bar array, depending on the finally determined resistance even without supply of external voltage.

In particular, the present disclosure configures the soft electronic system in the form of crossbar-shaped electrodes, thereby allowing to maintain stable device performance in spite of mechanical strain, e.g., the warping of the substrate.

FIG. 4 is a graph showing the log I-V characteristic of a soft memristor device according to an exemplary embodiment of the present disclosure.

Referring to FIG. 4, it can be seen that the resistance of the resistance-variable film changes with the increase of voltage and, as a result, the current value increases in a nonlinear fashion. On the contrary, if the voltage is maintained below a predetermined level, the current is reduced greatly due to the increase in resistance. That is, it can be seen that the desired logic value of the device according to the present disclosure can be achieved via the nonlinear change in the current of the device.

FIG. 5 shows the stable characteristics of soft memristor-based NOT and NOR gates for 50 cycles, and FIG. 6 shows the non-volatile nature of soft memristor-based NOT and NOR gates.

Referring to FIG. 5, it can be seen that the current value in the circuit is maintained stably during the 50 cycles.

FIG. 6 also shows that the output is maintained stably despite the lapse of time. This suggests the excellent non-volatile property of the device according to the present disclosure.

FIG. 7 shows the characteristics of soft memristor-based OR, AND and NAND gates, and FIG. 8 shows the characteristics of soft memristor-based NOT and NOR gates driven stably even under mechanical strain.

Referring to FIG. 8 in particular, it can be seen that the device according to the present disclosure wherein the electrodes are configured in the form of crossbars exhibits stable device output characteristic despite physical mechanical strain and, particularly, exhibits the non-volatile property even after lapse of time.

FIG. 9 illustrates a method for fabricating a memristor-based soft integrated device according to an exemplary embodiment of the present disclosure.

Referring to FIG. 9, a bar-type lower electrode in the form of a patterned array is prepared using a metal material such as Al. Then, a resistance-variable film is coated by a process such CVD. Finally, an upper electrode is formed to cross vertically. The resistance value of the resistance-variable film at the position where the upper and lower electrodes intersect is changed reversibly depending on the voltage condition of the electrode, and the logic value 0 or 1 can be stored from the resistance value. The fabrication process illustrated in FIG. 9 is only an example of the present disclosure, and the scope of the present disclosure is not limited by the fabrication process illustrated in FIG. 9.

FIG. 10 is a microscopic image of a memory- and logic device-integrated soft electronic system fabricated according to an exemplary embodiment of the present disclosure, and FIG. 11 is a cross-sectional TEM image of the device.

In the present disclosure, as described above, the logic gates NOT, NOR, OR, AND and NAND are implemented using the information stored in the soft memristors configured as a crossbar array and using the MAGIC method, and the logic gates are driven stably even under mechanical strain.

That is to say, in the present disclosure, the soft memristors are configured on a soft platform as a crossbar array, and the memory function of storing information in the soft memristors present on the crossbar array and the logic operation function of processing the stored information are implemented at the same time. In addition, the foundation of providing a soft electronic system that can significantly reduce standby power consumption is established by using the memristor on various software platforms via the memory and logic gate driving which is stable even under mechanical strain and the non-volatile nature of operation result.

The above description is only illustrative of the technical idea of the present disclosure, and those of ordinary skill in the art to which the present disclosure belongs can make various modifications and changes without departing from the essential features of the present disclosure. Accordingly, the examples described in the present disclosure are illustrative, not intended to limit the technical idea of the present disclosure, and the scope of the technical idea of the present disclosure is not limited by the examples. The scope of protection of the present disclosure should be interpreted by the following claims, and all technical ideas within equivalent scope should be construed as included in the scope of the present disclosure.

The invention claimed is:

1. A memory- and logic device-integrated soft electronic system, comprising:
   a substrate;
   a plurality of bar-type first electrodes stacked on the substrate;
   a resistance-variable material layer coated on the plurality of bar-type first electrodes; and
   a plurality of bar-shaped second electrodes stacked on the resistance-variable material layer,
   wherein the first electrode and the second electrode cross each other,
   wherein the resistance-variable material layer comprises a polymer-deposited insulating film, and
   wherein the polymer comprises any one selected from a group consisting of poly(cyclosiloxane), poly(furfuryl methacrylate), poly(isobornyl acrylate), poly(1,3,5-trimethyl-1,3,5-trivinylcyclotrisiloxane), poly(ethylene glycol dimethacrylate) and graphene oxide.

2. The memory- and logic device-integrated soft electronic system according to claim 1, wherein the resistance-variable material layer is coated on an entire surface of the first electrode, and the second electrode is provided on the resistance-variable material layer.

3. The memory- and logic device-integrated soft electronic system according to claim 1, wherein the memory- and logic device-integrated soft electronic system configures a logic gate in accordance with the memristor-aided logic (MAGIC) method.

4. The memory- and logic device-integrated soft electronic system according to claim 3, wherein the logic gate is NOT, NOR, OR, AND or NAND.

5. The memory- and logic device-integrated soft electronic system according to claim 1, wherein the first electrode and the second electrode comprises one selected from Cu, Ni, Ti, Hf, Zr, ZN, W, Co, V, Al and Pt.

6. The memory- and logic device-integrated soft electronic system according to claim 1, wherein the substrate has a flexible property.

* * * * *